(12) United States Patent
Liu et al.

(10) Patent No.: US 7,335,523 B2
(45) Date of Patent: Feb. 26, 2008

(54) PROCESS FOR MANUFACTURING A LIGHT-EMITTING DEVICE

(75) Inventors: Yu-Chuan Liu, Ping-zhen (TW); Chia-Ming Lee, Yilan County (TW); I-Ling Chen, Yilan County (TW); Jen-Inn Chyi, Pingzhen (TW)

(73) Assignee: Tekcore Co., Ltd. (TW)

( * ) Notice: Subject to any disclaimer, the term of this patent is extended or adjusted under 35 U.S.C. 154(b) by 207 days.

(21) Appl. No.: 11/339,251

(22) Filed: Jan. 25, 2006

(65) Prior Publication Data

US 2006/0119668 A1 Jun. 8, 2006

Related U.S. Application Data

(62) Division of application No. 10/815,091, filed on Mar. 31, 2004, now Pat. No. 7,227,192.

(51) Int. Cl.
*H01L 21/00* (2006.01)

(52) U.S. Cl. ........................... 438/29; 438/108

(58) Field of Classification Search ............ 438/22–47, 438/107
See application file for complete search history.

(56) References Cited

U.S. PATENT DOCUMENTS

| | | | |
|---|---|---|---|
| 6,100,103 A * | 8/2000 | Shim et al. .................... 438/26 |
| 6,485,993 B2 * | 11/2002 | Trezza et al. .................. 438/22 |
| 6,504,181 B2 * | 1/2003 | Furukawa et al. ............. 257/98 |
| 6,614,103 B1 * | 9/2003 | Durocher et al. ............ 257/678 |
| 7,022,550 B2 * | 4/2006 | Venugopalan ................ 438/108 |
| 7,098,063 B2 * | 8/2006 | Miyachi et al. ................ 438/33 |
| 2003/0160256 A1 * | 8/2003 | Durocher et al. .............. 257/88 |
| 2006/0055309 A1 * | 3/2006 | Ono et al. .................... 313/492 |
| 2006/0121642 A1 * | 6/2006 | Liu et al. ....................... 438/82 |
| 2006/0157721 A1 * | 7/2006 | Tran et al. ..................... 257/98 |
| 2007/0058059 A1 * | 3/2007 | Suehiro ....................... 348/294 |

* cited by examiner

*Primary Examiner*—Savitri Mulpuri
(74) *Attorney, Agent, or Firm*—David I. Roche; Baker & McKenzie LLP (57) ABSTRACT

A light-emitting device comprising a light-emitting unit including a plurality of first connecting pads, a base substrate including a plurality of second connecting pads, and a plurality of conductive bumps that connect the first connecting pads of the light-emitting unit to the second connecting pads of the base substrate. In the manufacturing process, a reflow process is performed to bond the conductive bumps to the first and second connecting pads. The light-emitting unit is configured to emit a first light radiation upon the application of an electric current flow, and the base substrate is configured to emit a second light radiation when stimulated by the first light radiation.

19 Claims, 9 Drawing Sheets

PROCESS FOR MANUFACTURING A LIGHT-EMITTING DEVICE

This is a divisional patent application, claiming priority to U.S. patent application Ser. No. 10/815,091 filed on Mar. 31, 2004 now U.S. Pat. No. 7,227,192.

FIELD OF THE INVENTION

The present invention generally relates to light-emitting devices, and particularly to the structure and manufacture of a white light-emitting device.

DESCRIPTION OF THE RELATED ART

A white light-emitting diode device usually implements the principle of color additive mixing to produce white light. The structure of a white light-emitting device conventionally includes at least two luminescent layers. A first luminescent layer is capable of emitting a first light radiation when subjected to an electric current flow. Upon stimulation of the first light radiation, a second luminescent layer emits a second light radiation which, being combined with the first light radiation, produces white light.

Figure 1:
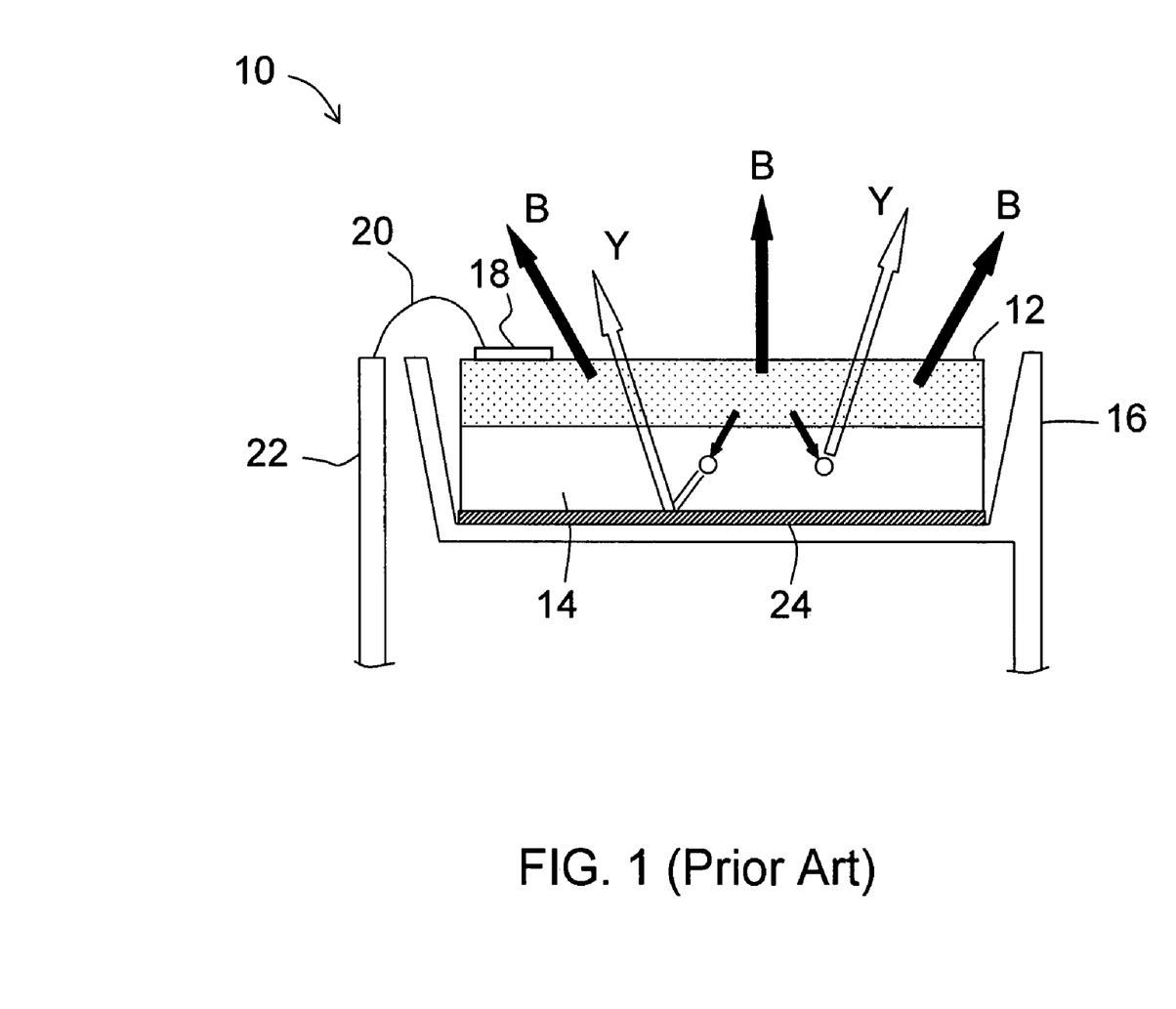
FIG. 1 is a schematic view of a white light-emitting device known in the art.

FIG. 1 is a schematic view of a white light-emitting diode known in the art. The white light-emitting device 10 includes a light-emitting diode 12 formed on a zinc-selenium (ZnSe)-based substrate 14. The light-emitting diode 12 conventionally include a plurality of layers (not shown) that may be either formed by epitaxy growth or attached on the ZnSe-based substrate 14. The light-emitting diode 12 and the substrate 14 are mounted on a support frame 16. Electrodes 18 of the light-emitting diode 12 are connected via wires 20 to contact leads 22. A reflective layer 24 is placed below the ZnSe-based substrate 14 to direct light towards the viewer side. Upon the application of an electric current, the light-emitting diode 12 conventionally emits a first radiation of blue (B) light. Being stimulated by the blue light, the ZnSe-based substrate 14 in turn emits a second radiation of yellow (Y) light. The combination of blue and yellow lights results in a white light perceived by the viewer.

In operation, the prior structure of light-emitting device appears to have a service life that is unsatisfactorily limited. One reason of this limitation may be a crystalline mismatch caused by the direct attachment or formation by growth of the layers constituting the light-emitting device on the ZnSe-based substrate. Therefore, there is presently a need for the structure of a light-emitting device, particularly implemented to emit white light, which can have an improved service life.

SUMMARY OF THE INVENTION

The application describes a light-emitting device and a manufacturing process of the light-emitting device. In one embodiment, a light-emitting device comprises a light-emitting unit including a plurality of first connecting pads, a base substrate including a plurality of second connecting pads, and a plurality of conductive bumps that connect the first connecting pads of the light-emitting unit to the second connecting pads of the base substrate. The light-emitting unit is configured to emit a first light radiation, and the base substrate is configured to emit a second light radiation when stimulated by the first light radiation.

In another embodiment, a process of forming a light-emitting device comprises forming a light-emitting unit provided with a plurality of first connecting pads, forming a base substrate provided with a plurality of second connecting pads, and connecting the light-emitting unit to the base substrate by means of a plurality of conductive bumps that bond the first connecting pads to the second connecting pads. The light-emitting unit is configured to emit a first light radiation, and the base substrate is configured to emit a second light radiation when stimulated with the first light radiation.

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION OF THE EMBODIMENT(S)

Figure 2A:
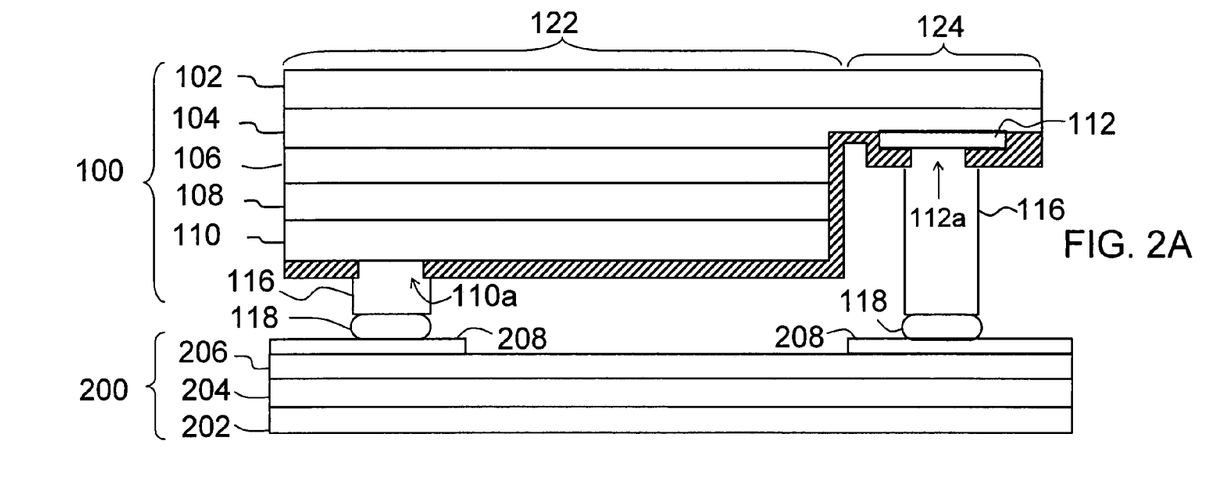
FIG. 2A~2C are schematic views of a white light-emitting device according to various embodiments of the invention.

FIG. 2A is a schematic view of a light-emitting device according to an embodiment of the invention. The light-emitting device includes a light-emitting unit 100 mounted to a base substrate 200 via conductive bumps 118. The light-emitting unit 100 is configured to emit a first light radiation. The base substrate 200 is configured to emit a second light radiation when stimulated by the first light radiation. The combination of the first and second light radiations results in a perception of a specific light color by the viewer. In the description herein, the light-emitting unit is exemplary illustrated as a light-emitting diode, but it is understood that the inventive features described herein can be generally implemented with any structures of light-emitting source.

The light-emitting unit 100 includes a light-emitting area 122 and an adjacent area 124. In the light-emitting area 122, a stack structure of the light-emitting unit 100 includes a substrate 102, a first cladding layer 104, an active layer 106, a second cladding layer 108 and a first ohmic contact layer 110. In the adjacent area 124, a portion of the first cladding layer 104 is covered with a second ohmic contact layer 112. A protective layer 114 is formed to cover a portion of the light-emitting unit 100 while exposing connecting pad areas 110a, 112a of the first and second ohmic contact layers 110, 112. Connecting pads 116 are respectively formed in contact with the exposed connecting pad areas 110a, 112a of the first and second ohmic contact layers 110, 112.

The base substrate 200 is formed from a stack structure that includes a substrate 202, a luminescent layer 204, a passivation layer 206 and connecting pads 208. Conductive bumps 118 connect the connecting pads 116 of the light-emitting unit 100 to the connecting pads 208 of the base substrate 200. Upon the application of a voltage bias between the connecting pads 208 of the base substrate 200, the light-emitting unit 200 emits a first light radiation. In an embodiment, the first light radiation can encompass a wavelength range of blue color. Stimulated by the first light radiation, the luminescent layer 204 of the base substrate 200 emits a second light radiation different from the first light radiation. In an embodiment, the second light radiation can encompass a wavelength range of yellow color. The combination of the first and second light radiations results in a perception by the viewer of a specific light color, i.e. white light emission, from the light-emitting device.

Figure 2B:
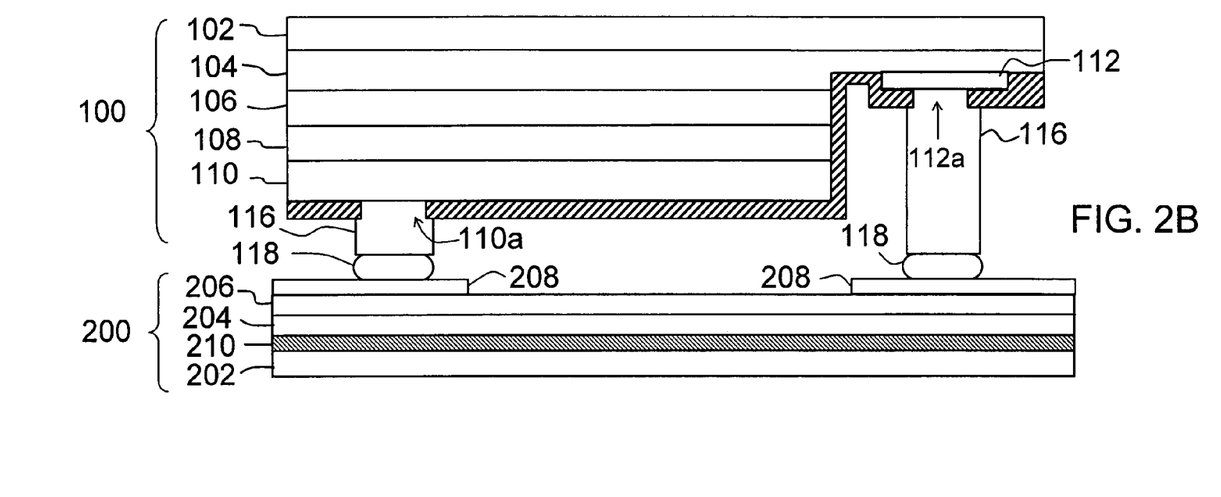
Figure 2C:
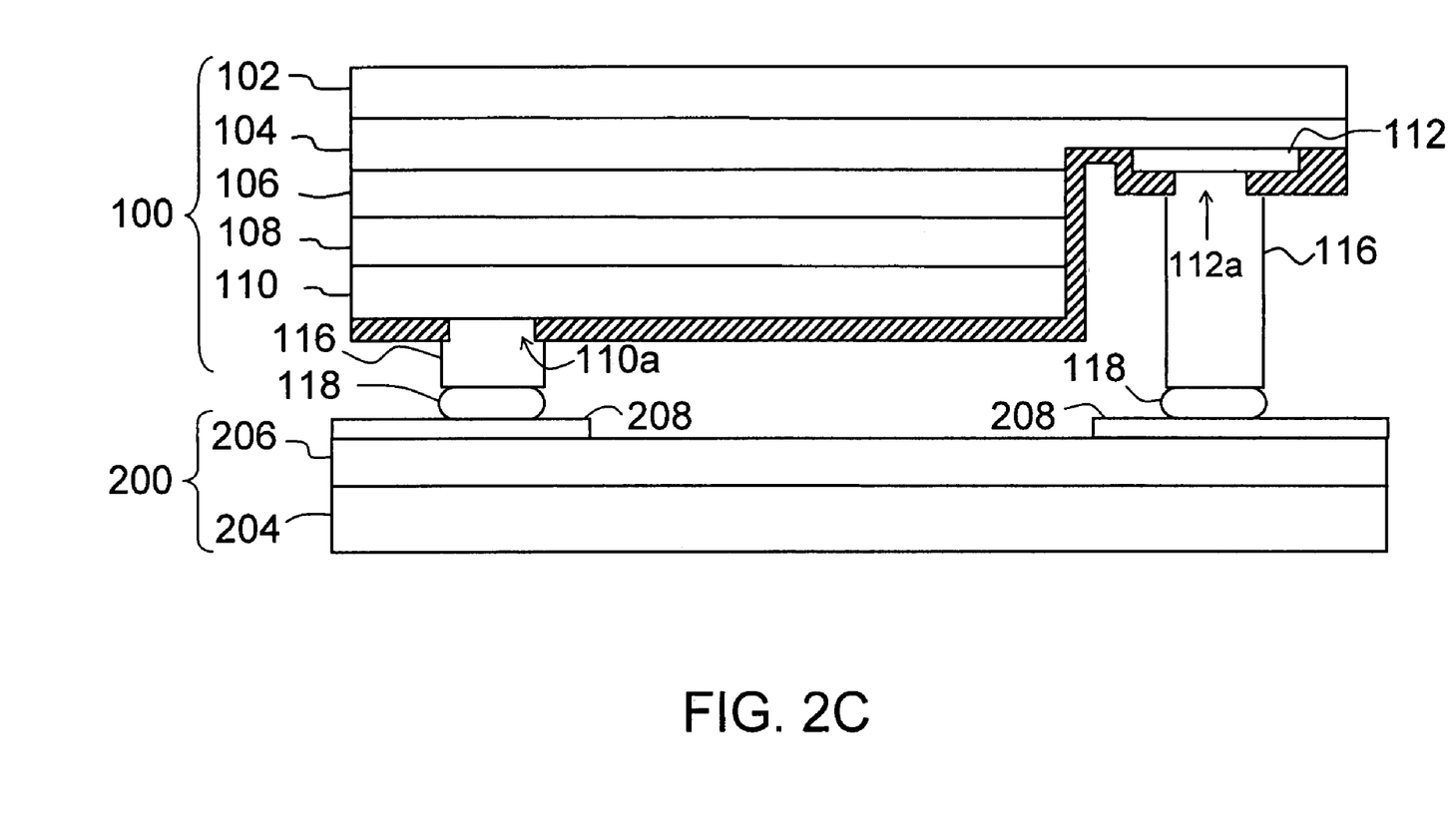

Many variations of the foregoing implementation can be envisaged. In FIG. 2B, the base substrate 200 can additionally include a reflective layer placed between the substrate 202 and the luminescent layer 204. The reflective layer can act to reflect light towards the viewer side. In the example of FIG. 2C, the substrate 202 can be omitted. Though not detailed herein, it is understood that other variant embodiments with respect to the structure of the light-emitting unit 100 can be further envisaged in accordance with the inventive features described herein.

Figure 3A:
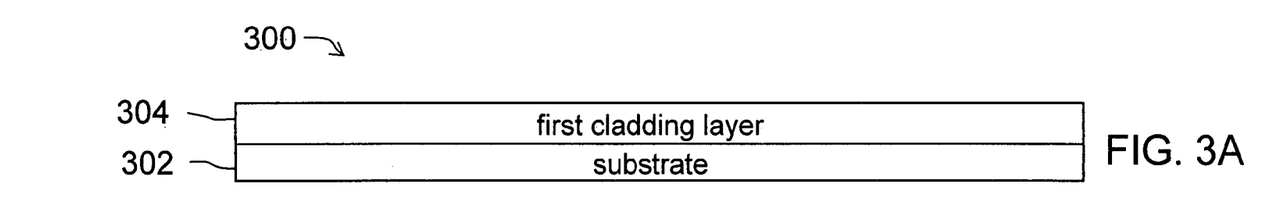
FIG. 3A~3H are schematic views of forming a light-emitting unit for a white light-emitting device according to an embodiment of the invention.

FIG. 3A~3H are schematic views of a process of forming a light-emitting unit 300 according to an embodiment of the invention. In FIG. 3A, a first cladding layer 304 is formed on a substrate 302. The substrate 302 can be made of a transparent electrically insulating material such as sapphire, SiC or the like. The first cladding layer 304 can include a group III nitride compound semiconductor material such as AlN, GaN, InN, AlGaN, InGaN, InAlGaN or the like. In an example of processing, a metal organic vapor phase epitaxy process can be conducted to form the group III nitride compound semiconductor, using a mixture of gasses including carrier gas $H_2$ or $N_2$, trimethylgallium ($Ga(CH3)_3$, or "TMG"), trimethylaluminum ($Al(CH_3)_3$, or "TMA"), trimethylindium ($In(CH_3)_3$, or "TMI"), silane ($SiH_4$), and cyclopentadienylmagnesium ($Mg(C_5H_5)_2$). N-type doping impurities such as silicon (Si), germanium (Ge), selenium (Se), sulfur (S), tellurium (Te) or the like, can be further introduced to dope the first cladding layer 304.

Figure 3B:
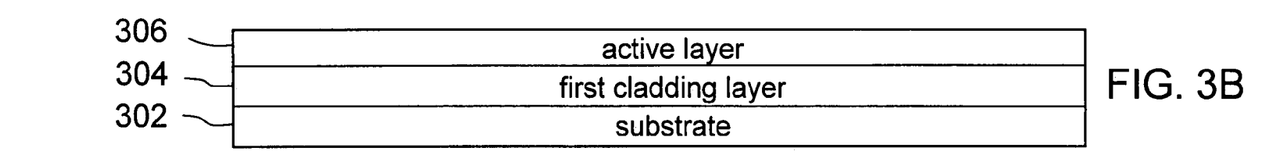

In FIG. 3B, an active layer 306 is formed on the first cladding layer 304. The active layer 306 can include either a single well structure or multi-quantum well structure layer. A multi-quantum structure layer is composed of an alternate lamination of well and barrier layers, including at least one layer made of a group III nitride compound semiconductor material.

Figure 3C:
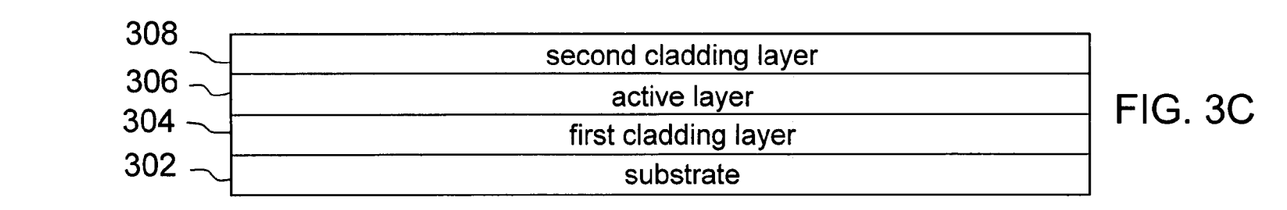

In FIG. 3C, a second cladding layer 308 is formed on the active layer 306. The second cladding layer 308 can include a group III nitride compound semiconductor material such as AlN, GaN, InN, AlGaN, InGaN, InAlGaN or the like. The second cladding layer 308 is doped with impurities of a conductance type opposite to that of the first cladding layer 304. In a case where the first cladding layer 304 is doped with n-type dopants, the second cladding layer 308 can be accordingly doped with p-type dopants.

Figure 3D:
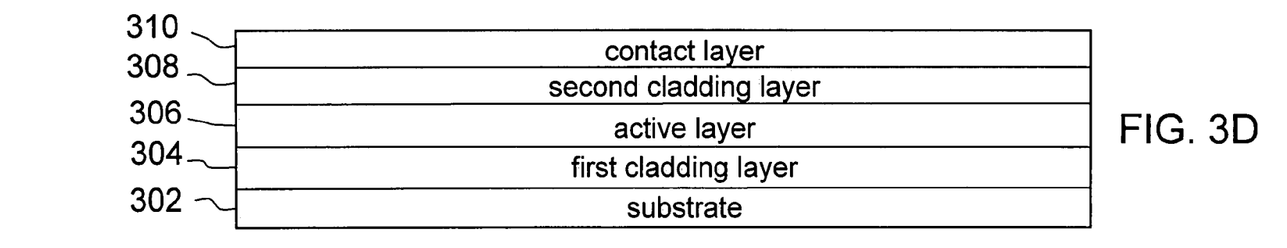

In FIG. 3D, an ohmic contact layer 310 is formed on the second cladding layer 308. Many types of conductive materials can be adequate to form the ohmic contact layer 310 including metallic alloys such as Ni/Au, Ni/Pt, Ni/Pd, Ni/Co, Pd/Au, Pt/Au, Ti/Au, Cr/Au, Sn/Au, Ta/Au, TiN, $TiWN_x$, $WSi_x$ or the like. Alternatively, the ohmic contact layer 310 can be also made of a transparent conductive oxide such as indium tin oxide, cadmium tin oxide, ZnO:Al, $ZnGa_2O_4$, $SnO_2$:Sb, $Ga_2O_3$:Sn, $AgInO_2$:Sn, $In_2O_3$:Zn, NiO, MnO, FeO, Fe2O3, CoO, CrO, $Cr_2O_3$, $CrO_2$, CuO, SnO, $Ag_2O$, $CuAlO_2$, $SrCu_2O_2$, $LaMnO_3$, PdO or the like.

Figure 3E:
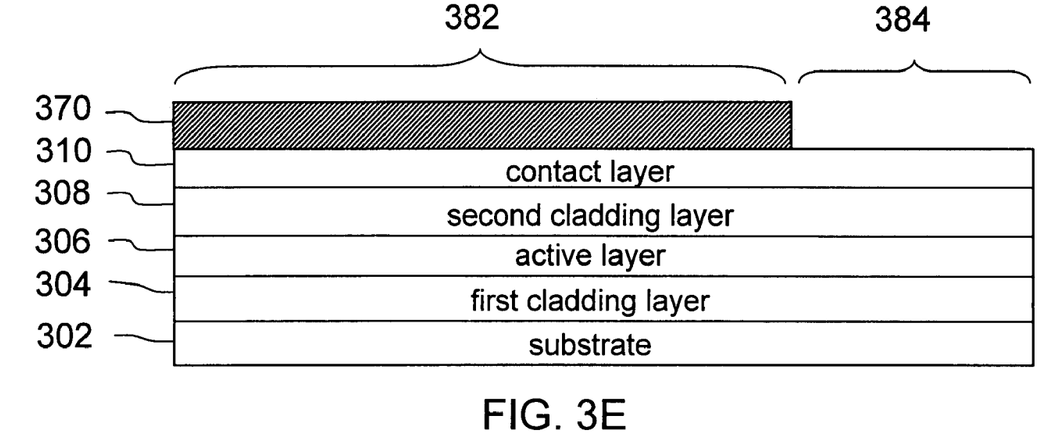

In FIG. 3E, a pattern mask 370 is formed on the ohmic contact layer 310. The pattern mask 370 can be a photoresist pattern deposited on the ohmic contact layer 310 via a photolithography process. An etching process is conducted through the pattern mask 370 to define a light-emitting area 382 covered by the pattern mask 370 and expose a portion of the first cladding layer 304 in an area 384 adjacent to the light-emitting area 382.

Figure 3F:
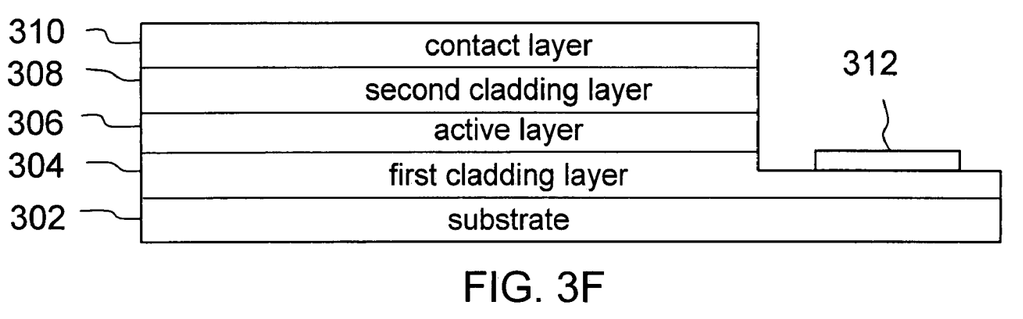

As shown in FIG. 3F, the pattern mask 370 then is removed, and another ohmic contact layer 312 is formed on the exposed portion of the first cladding layer 304 in the area 384. The ohmic contact layer 312 can be made of a metallic alloy including Ti/Al, Ti/Al/Ti/Au, Ti/Al/Pt/Au, Ti/Al/Ni/Au, Ti/Al/Pd/Au, Ti/Al/Cr/Au, Ti/Al/Co/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au, Nd/Al/Co/A, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, $TiN_x$/Ti/Au, $TiN_x$/Pt/Au, $TiN_x$/Ni/Au, $TiN_x$/Pd/Au, $TiN_x$/Cr/Au, $TiN_x$/Co/Au $TiWN_x$/Ti/Au, $TiWN_x$/Pt/Au, $TiWN_x$/Ni/Au, $TiWN_x$/Pd/Au, $TiWN_x$/Cr/Au, $TiWN_x$/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au, Ti/NiAl/Cr/Au or the like.

Figure 3G:
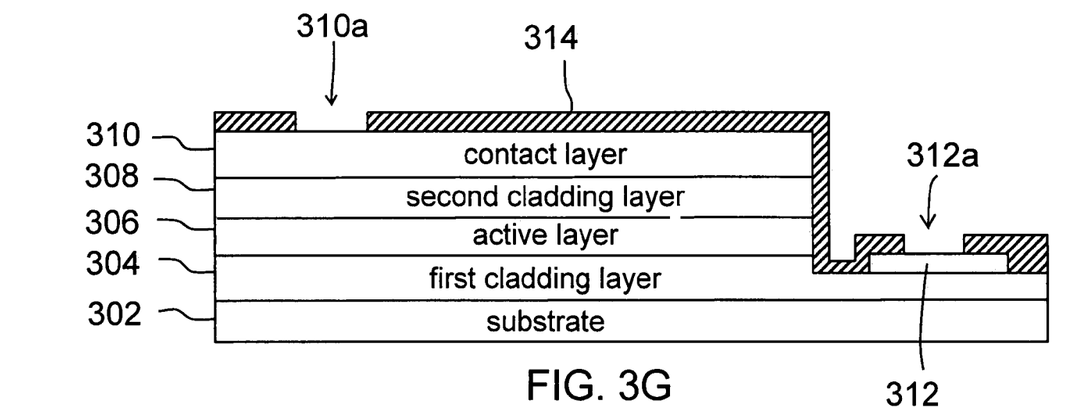

In FIG. 3G, a passivation layer 314 is formed to cover a portion of the stack structure while leaving exposed areas 310a, 312a of the first and second ohmic contact layers 310, 312. The passivation layer 314 can be made of a dielectric material such as $SiO_2$ or the like.

Figure 3H:
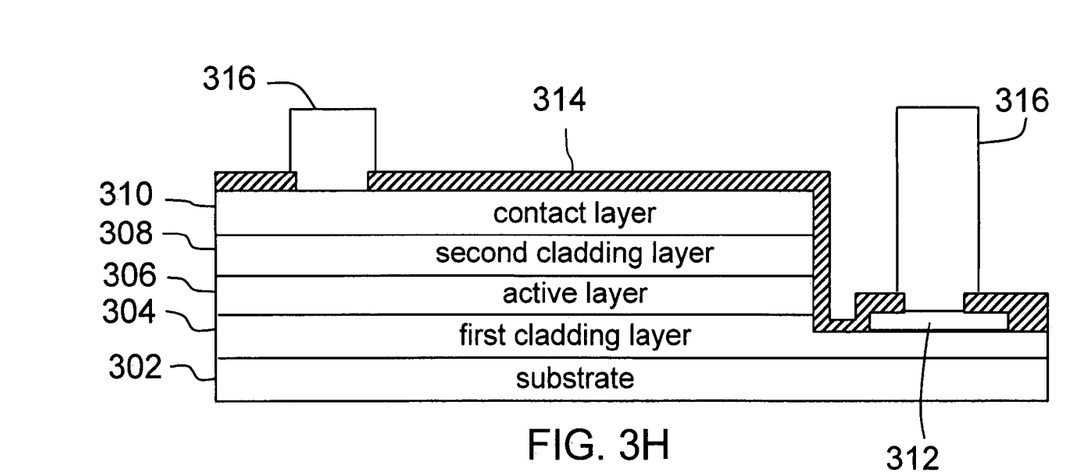

In FIG. 3H, connecting pads 316 are respectively formed in contact with the exposed areas 310a, 312a of the first and second ohmic contact layers 310, 312. The connecting pads 316 can be made of a conductive material such as a metal or alloy of metallic materials.

Reference now is made to FIG. 4A~4E to describe a process of forming a base substrate according to various embodiments of the invention.

Figure 4A:
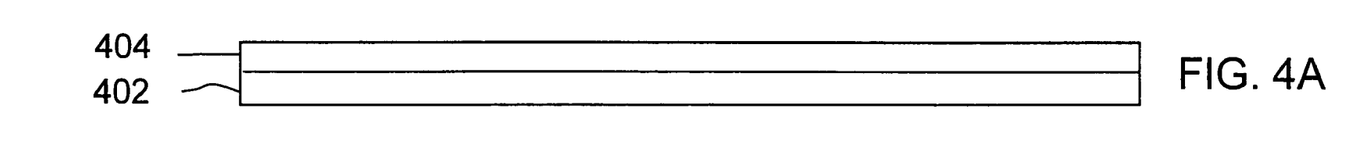
FIG. 4A~4E are schematic views of a process of forming a base substrate for a white light-emitting device according to various embodiments of the invention.

In FIG. 4A, a luminescent layer 404 is formed on a substrate 402. The substrate 402 can be made of a silicon (Si)-based material. In an embodiment, the luminescent layer 404 can be made of a zinc-selenium (ZnSe)-based material doped with iodine, aluminum, chlorine, bromine, gallium, indium or the like to provide a conductance of the n-type. A homoepitaxy growth can be conducted to form the ZnSe-based layer on the substrate 402.

In a variant embodiment, the luminescent layer 404 can be made of a material bled including a phosphor powder and a passivation material such as benzocyclobutene (BCB), an epoxy-based negative resist or the like. The mixture including the passivation material and the phosphor powder can be spin-coated in liquid form on the substrate 402. A heating process then is performed to solidify and form the luminescent layer 404. Notwithstanding the foregoing specific examples, it is understood that many other material associations can be suitable to form the luminescent layer.

Figure 4B:
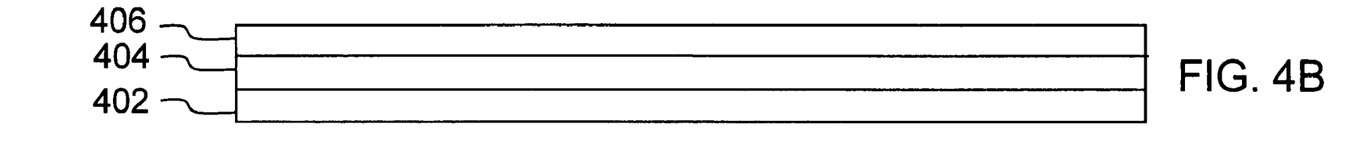

In FIG. 4B, a passivation layer 406 is formed to cover the luminescent layer 404. The passivation layer 406 can be made of a dielectric material such as $SiO_2$ or the like deposited on the luminescent layer 404.

Figure 4C:
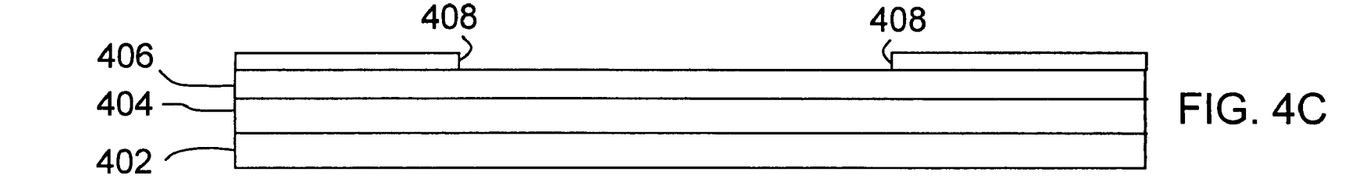

In FIG. 4C, connecting pads 408 are formed on the passivation layer 406. The connecting pads 408 are made of a conductive material such as a metal or alloy of metallic materials.

Figure 4D:
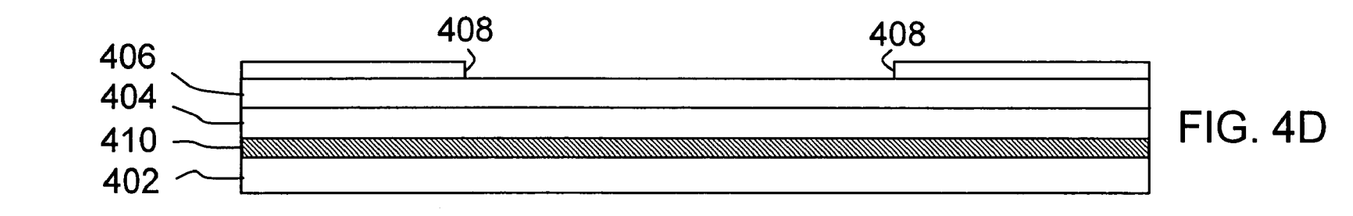
Figure 4E:
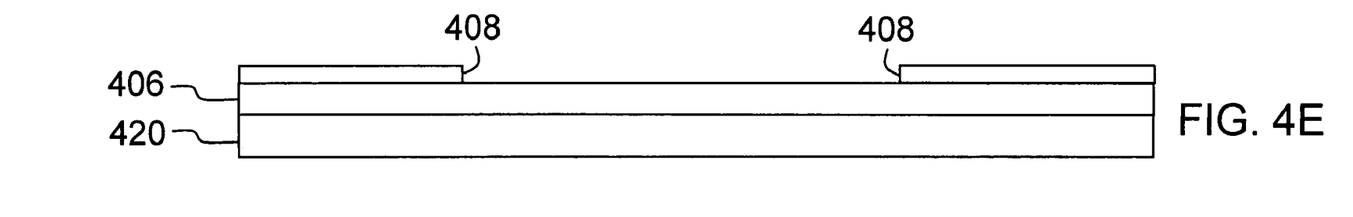

In the variant example of FIG. 4D, a reflective layer 410 can be included between the luminescent layer 404 and the substrate 402. The reflective layer 410 can be made of a metallic material or a dielectric material. In another variant example shown in FIG. 4E, the base substrate can be composed of a ZnSe-based substrate 420 on which are formed the passivation layer 406 and connecting pads 408.

Figure 5A:
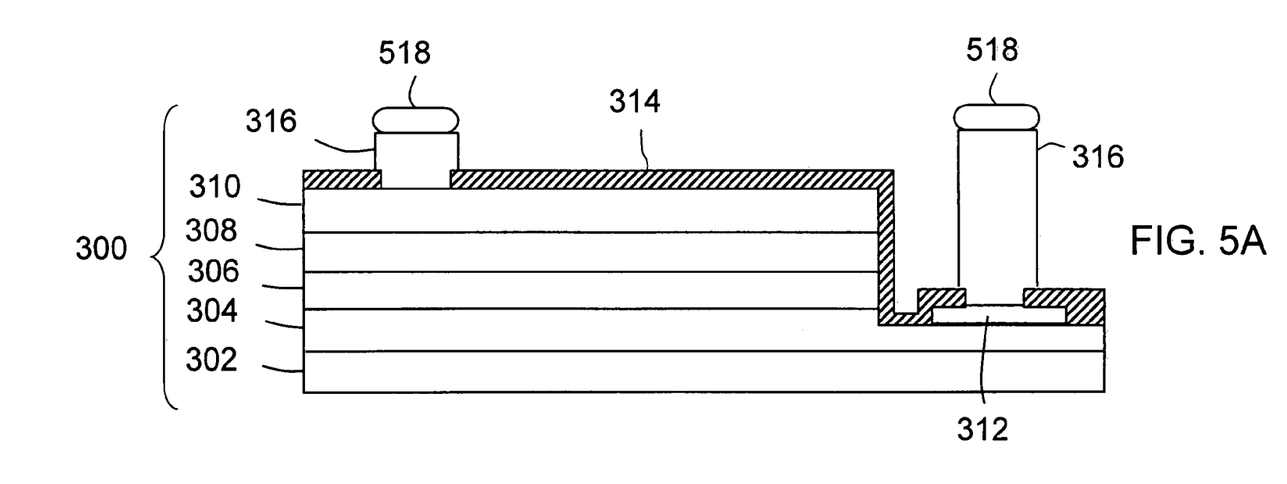
FIG. 5A~5B are schematic views of a process of mounting a light-emitting unit to a base substrate to form a white light-emitting device according to an embodiment of the invention.
Figure 5B:
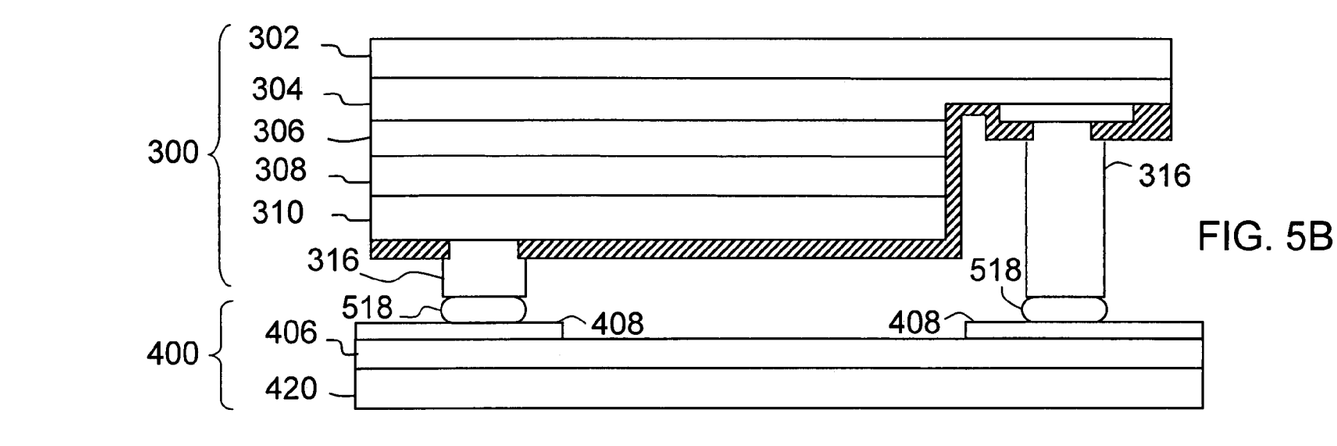

FIGS. 5A and 5B are schematic views of a process of mounting a light-emitting unit to a base substrate according to an embodiment of the invention. In FIG. 5A, conductive bumps 518 are formed on connecting pads 316 of the light-emitting unit 300. In an example of implementation, the conductive bumps 518 can be made of a solder material.

In FIG. 5B, the light-emitting unit 300 is positioned so as to have the conductive bumps 518 in contact with connecting pads 408 of the base substrate 400. A reflow process then is conducted to fixedly attach and connect the connecting pads 316, 408 to one another. The light-emitting unit 300 thereby is mounted and electrically connected to the base substrate 400.

Figure 5C:
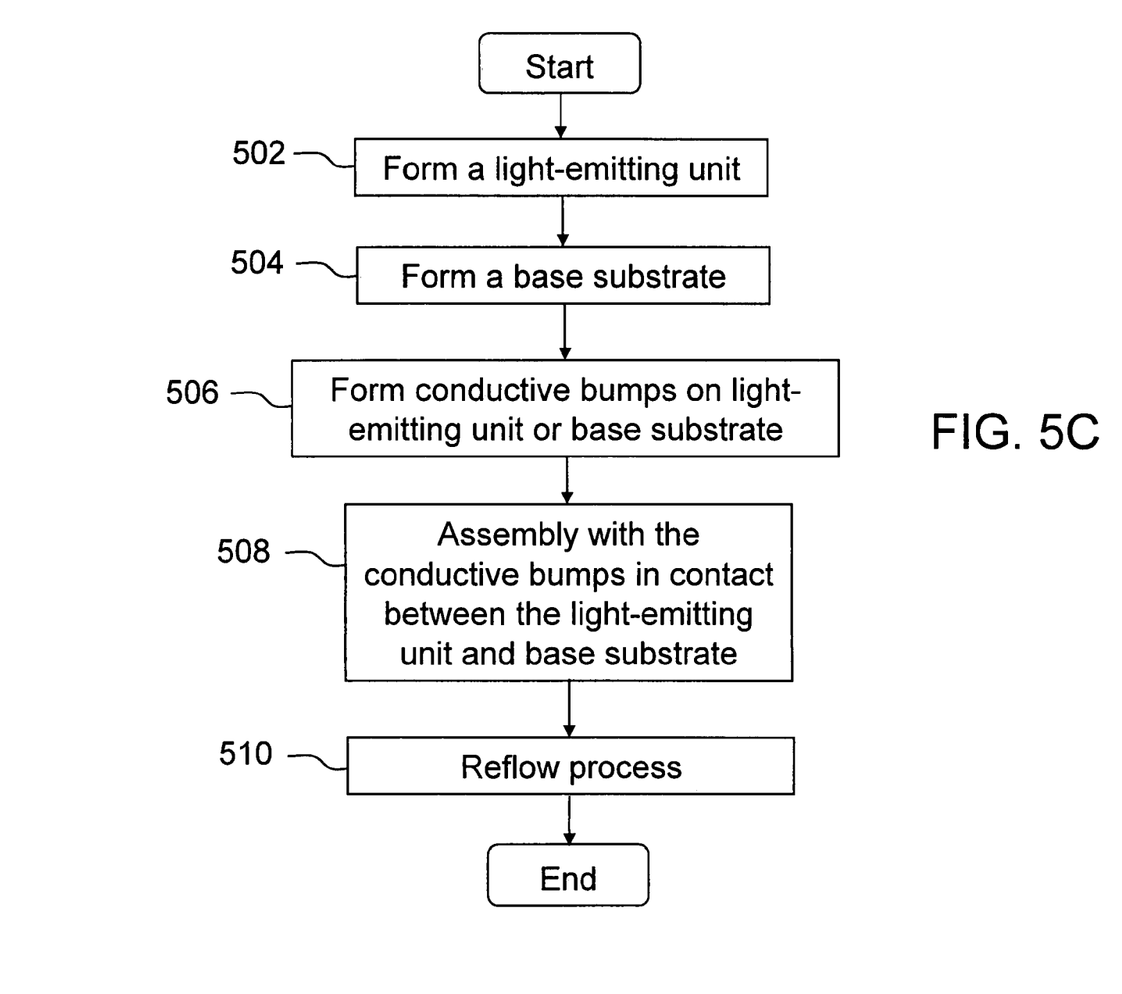
FIG. 5C is a flowchart describing a process of manufacturing a white light-emitting device according to an embodiment of the invention.

FIG. 5C is a flowchart describing the process of forming a white light-emitting device according to an embodiment of the invention. The process includes forming a light-emitting unit provided with a plurality of first connecting pads (502), and forming a base substrate provided with a plurality of second connecting pads (504). The light-emitting unit emits a first light radiation upon the application of a voltage bias between the first connecting pads. The base substrate is configured to emit a second light radiation when stimulated by the first light radiation. Conductive bumps are formed on either the first or second connecting pads (506). The light-emitting unit and the base substrate then are assembled with the conductive bumps in contact between the first and second connecting pads (508). A reflow process then is performed to connect the first and second connecting pads to one another (510). The light-emitting unit is thereby assembled with the base substrate to form a light-emitting device.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A process of forming a light-emitting device, comprising:
    forming a light-emitting unit provided with a plurality of first connecting pads, wherein the light-emitting unit is configured to emit a first light radiation;
    forming a base substrate provided with a plurality of second connecting pads, wherein the base substrate is configured to emit a second light radiation when stimulated with the first light radiation;
    forming a plurality of conductive bumps on either the first or second connecting pads;
    placing the light-emitting unit and the base substrate so that the first light radiation and the second light radiation when being produced mix each other to create a visible color light different from the first and second light radiations, wherein forming the base substrate comprises: forming a luminescent layer; forming a passivation layer covering the luminescent layer; forming the second conductive pads over the passivation layer; and
    connecting the first and second connecting pads via the conductive bumps.

2. The process of claim 1, wherein connecting the first and second connecting pads via the conductive bumps comprises:
    placing the light-emitting unit so that the conductive bumps contact with the second connecting pads of the base substrate; and
    performing a reflow process.

3. The process of claim 1, wherein the conductive bumps include solder bumps.

4. The process of claim 1, wherein forming a light-emitting unit comprises:
    forming a multi-layer structure including a first substrate, a first cladding layer, an active layer, a second cladding layer and a second ohmic contact layer;
    patterning the multi-layer structure to expose an area of the first cladding layer;
    forming a first ohmic contact layer on the exposed area of the first cladding layer;
    forming an insulating layer to cover a portion of the multi-layer structure, wherein the insulating layer exposes areas of the first and second ohmic contact layers; and
    forming the first connecting pads in the exposed areas of the first and second ohmic contact layers.

5. The process of claim 4, wherein the first substrate includes a sapphire substrate, or a SiC substrate.

6. The process of claim 4, wherein the first cladding layer includes an n-type GaN layer.

7. The process of claim 4, wherein the active layer includes a multi-quantum well multi-layer structure or a single well structure.

8. The process of claim 4, wherein the second cladding layer includes a p-type GaN layer.

9. The process of claim 4, wherein the first ohmic contact layer is made of a metallic alloy including Ti/Al, Ti/Al/Ti/Au, Ti/Al/Pt/Au, Ti/Al/Ni/Au, Ti/Al/Pd/Au, Ti/Al/Cr/Au, Ti/Al/Co/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au, Nd/Al/Co/A, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiN$_x$/Cr/Au, TiN$_x$/Co/Au TiWN$_x$/Ti/Au, TiWN$_x$/Pt/Au, TiWN$_x$/Ni/Au, TiWN$_x$/Pd/Au, TiWN$_x$/Cr/Au, TiWN$_x$/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au, or Ti/NiAl/Cr/Au.

10. The process of claim 4, wherein the second ohmic contact layer is made of a metallic alloy including Ni/Au, Ni/Pt, Ni/Pd, Ni/Co, Pd/Au, Pt/Au, Ti/Au, Cr/Au, Sn/Au, Ta/Au, TiN, $TiWN_x$, $WSi_x$.

11. The process of claim 4, wherein the second ohmic contact layer is made of a transparent conductive oxide including indium tin oxide, cadmium tin oxide, ZnO:Al, $ZnGa_2O_4$, $SnO_2$:Sb, $Ga_2O_3$:Sn, $AgInO_2$:Sn, $In_2O_3$:Zn, NiO, MnO, FeO, $Fe_2O_3$, CoO, CrO, $Cr_2O_3$, $CrO_2$, CuO, SnO, $Ag_2O$, $CuAlO_2$, $SrCu_2O_2$, $LaMnO_3$, or PdO.

12. The process of claim 1, wherein the luminescent layer includes ZnSe-based material.

13. The process of claim 1, wherein the luminescent layer is made of a material blend including at least one phosphor powder and benzocyclobutene or an epoxy-based negative resist.

14. The process of claim 1, wherein the passivation layer includes $SiO_2$.

15. The process of claim 1, wherein forming the base substrate further comprises:

forming a reflective layer over a surface of a second substrate; and forming the luminescent layer over a surface of the reflective layer.

16. The process of claim 15, wherein the second substrate includes a silicon-based material.

17. The process of claim 15, wherein the reflective layer includes a metallic material.

18. The process of claim 15, wherein the reflective layer includes an insulating dielectric material.

19. The process of claim 4, wherein patterning the multi-layer structure to expose an area of the first cladding layer comprises:

forming a photoresist pattern;

etching through the photoresist pattern until an area of the first cladding layer is exposed; and removing the photoresist pattern.

* * * * *